(12) United States Patent
Mai (10) Patent No.: US 7,656,223 B2
(45) Date of Patent: Feb. 2, 2010

(54) DELAY LOCKED LOOP CIRCUIT

(75) Inventor: Huy Tuong Mai, Kanata (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 0 days.

(21) Appl. No.: 12/193,077

(22) Filed: Aug. 18, 2008

(65) Prior Publication Data

US 2008/0303569 A1    Dec. 11, 2008

Related U.S. Application Data

(63) Continuation of application No. 11/668,862, filed on Jan. 30, 2007, now Pat. No. 7,459,949.

(51) Int. Cl.
*G05F 1/10*    (2006.01)
(52) U.S. Cl. .................... 327/536; 327/157
(58) Field of Classification Search ........ None
See application file for complete search history.

(56) References Cited

U.S. PATENT DOCUMENTS

| | | | |
|---|---|---|---|
| 4,792,705 A | 12/1988 | Ouyang et al. | |
| 5,465,388 A | 11/1995 | Zicker | |
| 5,734,279 A | 3/1998 | Bereza | |
| 5,966,033 A | 10/1999 | Miller | |
| 6,271,729 B2 | 8/2001 | Sung et al. | |
| 6,304,116 B1 | 10/2001 | Yoon et al. | |
| 6,393,284 B1 | 5/2002 | Dent | |
| 6,407,601 B1 | 6/2002 | Lin | |
| 6,472,914 B1 | 10/2002 | Gu et al. | |
| 6,483,389 B1 | 11/2002 | Lamb | |
| 6,525,684 B2 * | 2/2003 | Tsujikawa | 341/155 |
| 6,646,478 B2 | 11/2003 | Lamb | |
| 6,717,446 B1 * | 4/2004 | Vu | 327/157 |
| 6,724,265 B2 * | 4/2004 | Humphreys | 331/17 |
| 6,774,689 B1 | 8/2004 | Sudjian | |
| 6,876,240 B2 | 4/2005 | Moon et al. | |
| 6,897,690 B2 | 5/2005 | Keaveney et al. | |
| 6,906,565 B2 | 6/2005 | Keaveney | |
| 6,952,462 B2 | 10/2005 | Harrison | |
| 6,958,636 B2 | 10/2005 | Boerstler et al. | |

(Continued)

OTHER PUBLICATIONS

U.S. Appl. No. 11/691,849, Notice of Allowance dated Dec. 24, 2008.

(Continued)

*Primary Examiner*—Cassandra Cox
(74) *Attorney, Agent, or Firm*—Shin Hung; Borden Ladner Gervais LLP (57) ABSTRACT

The disclosure relates to phase detectors. Charge up and charge down signals that are generated by a phase detector cause i) following detection of a first edge of a reference clock signal, switching on of a switching transistor of sink current; ii) following detection of an edge of a feedback clock signal falling within less than 180 degrees from the first edge, switching on of a switching transistor of source current and switching off of the switching transistor of sink current; and iii) following detection of an edge of another reference signal at a point in time about midway between the first edge and a next similar edge of the reference clock signal has past, switching off of the switching transistor of source current while maintaining the switching transistor of sink current switched off.

22 Claims, 8 Drawing Sheets

U.S. PATENT DOCUMENTS

| | | | |
|---|---|---|---|
| 6,975,840 B2 * | 12/2005 | Lin | 455/76 |
| 6,989,698 B2 | 1/2006 | Jeong | |
| 6,995,607 B2 | 2/2006 | Dosho et al. | |
| 7,271,621 B2 | 9/2007 | Metz | |
| 7,443,250 B2 * | 10/2008 | Seethamraju et al. | 331/17 |
| 7,511,543 B2 * | 3/2009 | Friedman et al. | 327/156 |
| 2006/0170471 A1 | 8/2006 | Haerle et al. | |

OTHER PUBLICATIONS

U.S. Appl. No. 11/691,849, Office Action dated Jun. 6, 2008.

Kim et al., "A 64-MByte/s Bidirectional Data Strobed, Double-Data-Rate SDRAM with a 40-mW DLL for a 256-MByte Memory System", IEEE Journal of Solid-State Circuits, vol. 33(11), Nov. 1998, pp. 1703-1710.

Moon et al., "An All-Analog Multiphase Delay-Locked Loop Using a Replica Delay Line for Wide Range Operation and Low-Jitter Performance", IEEE Journal of Solid-State Circuits, vol. 35(3), Mar. 2000, pp. 377-384.

* cited by examiner

DELAY LOCKED LOOP CIRCUIT

CROSS REFERENCE TO RELATED APPLICATIONS

This application is a Continuation of U.S. patent application Ser. No. 11/668,862 entitled "Phase Detector Circuit and Method therefor" filed on Jan. 30, 2007, the disclosure of which is expressly incorporated herein by reference in its entirety.

BACKGROUND OF THE DISCLOSURE

Figure 1:
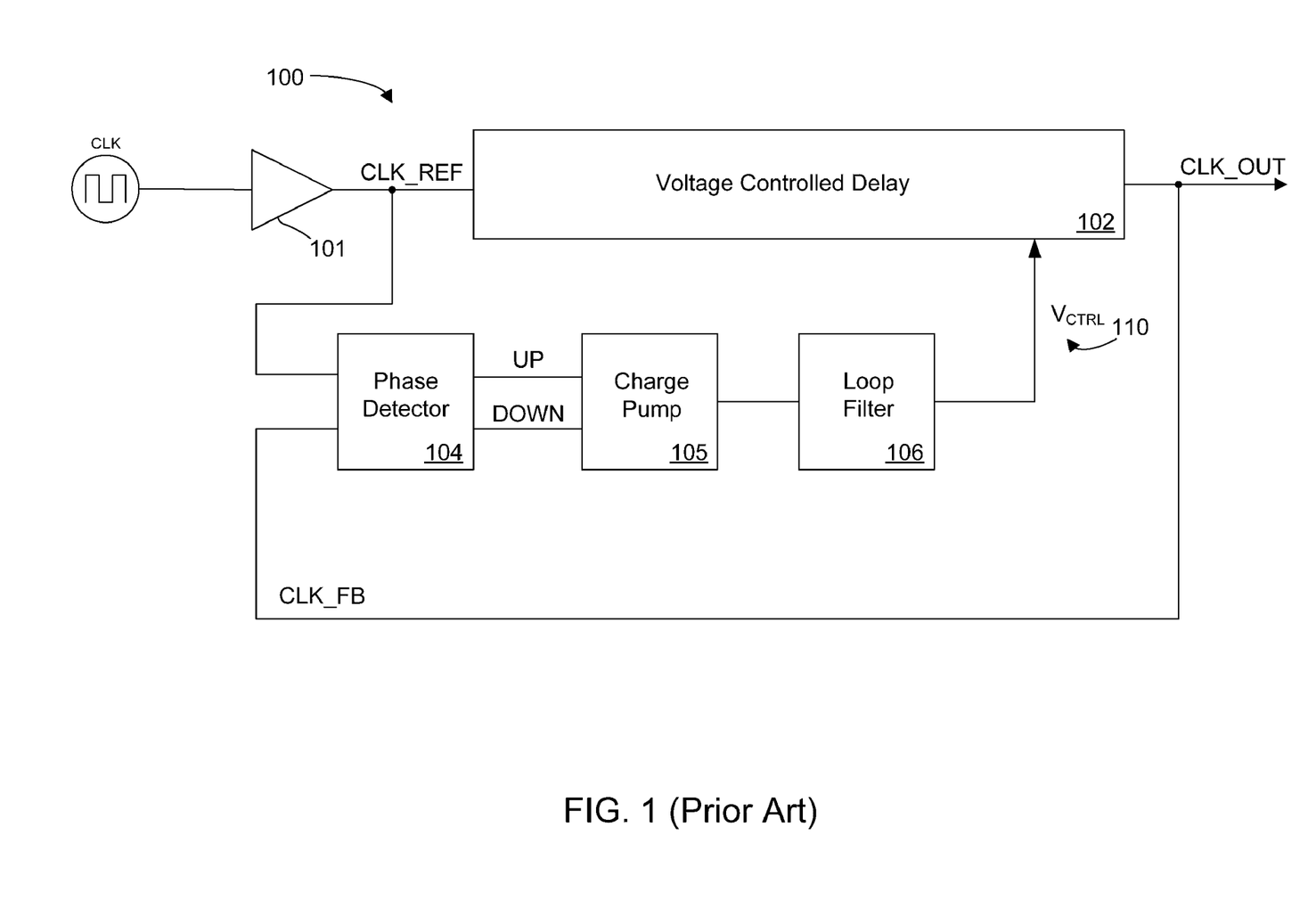
FIG. 1 is a block diagram of a prior art DLL.

FIG. 1 is a block diagram of a prior art Delay-Locked Loop (DLL) 100. In the DLL 100, an externally supplied clock (CLK) is buffered by clock buffer 101 to provide a reference clock (CLK_REF). As understood by those skilled in the art, the CLK signal could be, for example, a data strobe signal (DQS or DQSb signal) transmitted from a memory controller to a memory device. However, it is of course possible that the CLK signal will, in alternative examples, be some other type of clock signal. Continuing on with the discussion of the DLL block diagram of FIG. 1, it will be seen that CLK_REF is coupled to a Voltage Controlled Delay Line (VCDL) 102 and a phase detector 104. The VCDL 102 produces an output clock (CLK_OUT), which is a delayed version of CLK_REF and is routed to various circuits within the device containing the DLL 100. As shown, CLK_OUT is also routed to the phase detector 104, and thus the phase detector 104 receives CLK_OUT as a feedback clock signal, referred to as CLK_FB.

With respect to phase shifting by the DLL, those skilled in the art will appreciate that in some memory systems where the timing signal being phase shifted is DQS or DQSb, the timing signal will be shifted by 90 degrees so that the edges of the timing signal are centered with respect to its associated data. Also, as clock frequencies in memory systems become increasingly higher, the ability to make fine-tuned phase shifting adjustments will continue to become increasingly useful.

Still with reference to the illustrated DLL 100, the phase detector 104 generates phase control signals (UP/DOWN) dependent on the phase difference between CLK_REF and CLK_FB. The phase control signals (UP/DOWN) of the phase detector 104 are provided to a charge pump 105, the output thereof which is conditioned by a loop filter 106 to provide a variable bias voltage $V_{CTRL}$ 110. Those skilled in the art will understand that loop filter 106 can include any number of passive components arranged in a desired configuration. The bias voltage $V_{CTRL}$ selects the delay to be added to CLK_REF by the VCDL 102 to provide for the proper phase relation between CLK_FB and CLK_REF. VCDL 102 can be implemented with a variety of known circuits.

Figure 2:
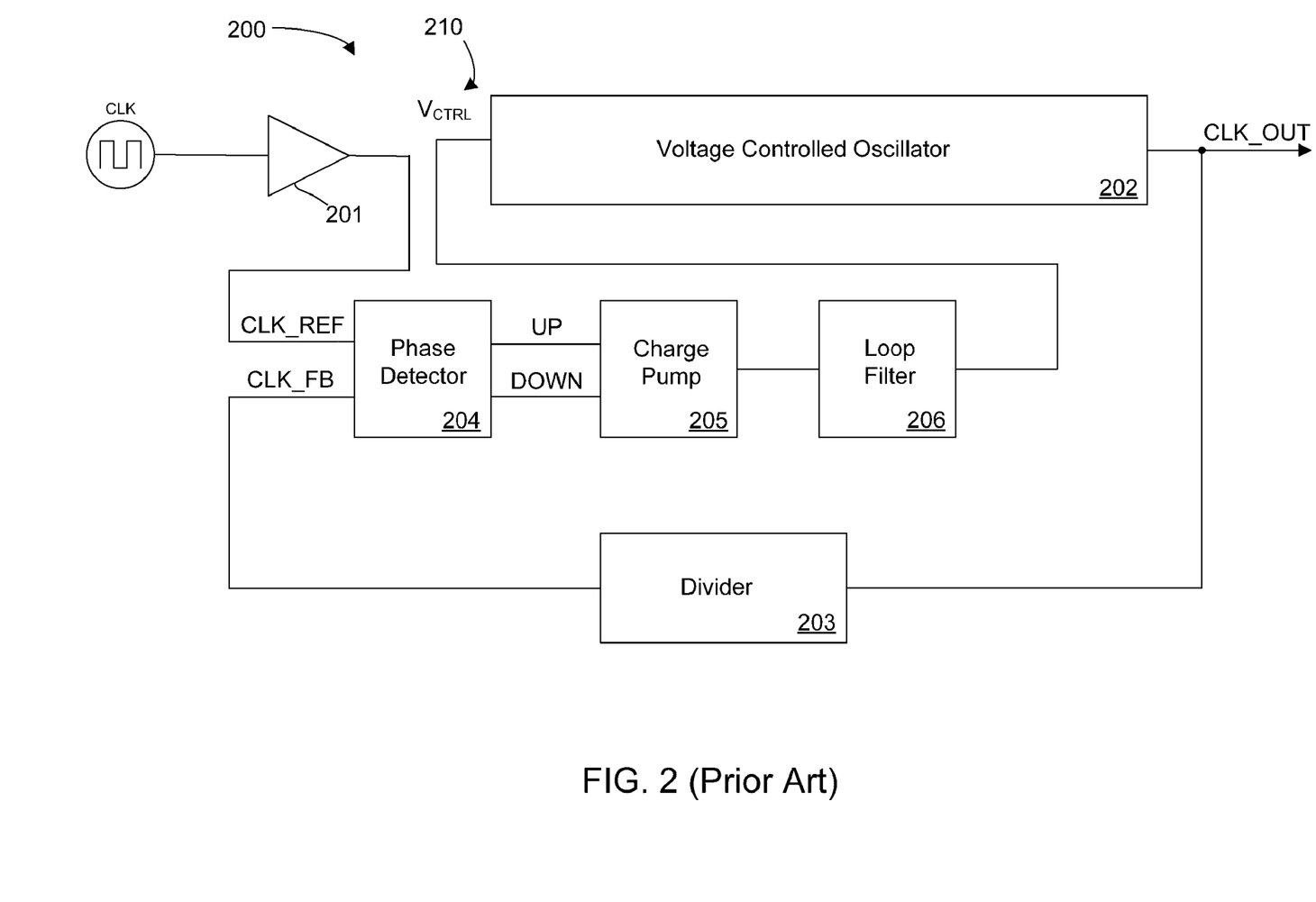
FIG. 2 is a block diagram of a prior art PLL.

Another type of feedback system known to those skilled in the art of memory design is a Phase-Locked Loop (PLL). FIG. 2 is a block diagram of a prior art PLL 200. An externally supplied clock (CLK) is buffered by clock buffer 201 to provide a reference clock (CLK_REF) that is coupled to a phase detector 204. The phase detector 204 generates phase control signals (UP/DOWN) dependent on the phase difference between CLK_REF and CLK_FB.

The phase control signals (UP/DOWN) of the phase detector 204 are provided to a charge pump 205, the output thereof which is conditioned by a loop filter 206 to provide a variable bias voltage $V_{CTRL}$ 210. The bias voltage $V_{CTRL}$ controls a Voltage Controlled Oscillator (VCO) 202 which outputs a clock signal CLK_OUT. The frequency of the output clock signal CLK_OUT is proportional to the bias voltage $V_{CTRL}$ 210. Also, the CLK_OUT signal is optionally coupled to a divider 203 to produce the CLK_FB signal.

Having now described the general architecture of PLLs and DLLs, it will be understood that the operation of a particular DLL will not always be independent of other PLLs present in the larger memory design. For example, two 90 degree phase shifted DQS and DQSb signals available within a master PLL can be provided to a slave DLL. It will be understood that, in such circumstances, the slave DLL output is dependent upon the phase and frequency information that the master PLL provides. This dependency is not necessarily disadvantageous, and it has been found, generally speaking, that slave DLLs relying upon master PLLs, as described above, provide output clocks that are, for a large majority of presently existing applications, properly phase shifted relative to the reference clock.

While it is preferable that the output clock signal of a DLL be properly phase shifted relative to the reference clock signal, future improvements in DLLs may relate to other aspects of the DLL, such as reduced power consumption, for example. In this regard, phase detector circuits in accordance with at least some example embodiments permit implementation of DLLs with reduced power consumption.

SUMMARY

According to one example embodiment, there is a method for providing charge up and charge down control signals having active and inactive logic levels to a charge pump in a delay-locked loop. The charge pump charging a capacitance in response to the active logic level of the charge up signal, and discharging the capacitance in response to the active logic level of the charge down signal. In response to detection of a first edge of a reference clock signal, there is a change of logic levels of the charge down signal from the inactive logic level of the charge down signal to the active logic level of the charge down signal. In response to detection of an edge of a feedback clock signal falling within less than 180 degrees from the first edge, there is a change of logic levels of the charge up signal from the inactive logic level of the charge up signal to the active logic level of the charge up signal, and there is a change of logic levels of the charge down signal from the active logic level of the charge down signal to the inactive logic level of the charge down signal. In response to detection that an edge of an additional reference signal at a point in time about midway between the first edge and a subsequent edge of the reference clock signal has past, changing the active logic level of the charge up signal to the inactive logic level, while maintaining the charge down signal at the inactive logic level.

According to another example embodiment, there is a delay-locked loop that includes a voltage control delay line for receiving a reference clock signal and for delaying the reference clock signal to provide a feedback clock signal. A phase detector for receiving the reference clock signal and the feedback clock signal. The phase detector generating charge up and charge down control signals dependent upon a phase difference between the reference clock signal and the feedback clock signal. A loop filter includes a capacitor for providing a variable bias voltage for selecting a delay to be added to the reference clock signal by the voltage control delay line. A charge pump includes at least two switching transistors. One of the switching transistors permits current to be added into the capacitor when switched on in response to the charge up signal. Another of the switching transistors permits current to be removed from the capacitor when switched on in response to the charge down signal. The switching transistor of source current is controlled by the charge up signal and the switching transistor of sink current is controlled by the charge down signal. The phase detector receives the reference clock signal, an additional reference signal, and the feedback clock signal. The phase detector generates a charge up control signal having a first duration of time in response to a first edge of the reference clock signal. A charge down control signal has a second duration of time in response to an edge of the feedback clock signal occurring within less than 180 degrees from the first edge. The first duration of time is substantially similar to a first time between the first edge of the reference clock signal and the edge of the feedback clock signal. The second duration of time is substantially similar to a second time between the edge of the feedback clock signal and a midway signal edge occurring between the first edge and a subsequent edge of the reference clock signal.

According to yet another example embodiment, there is a delay-locked loop that includes a voltage control delay line for receiving a reference clock signal. A phase detector also receives the reference clock signal and generates charge up and charge down control signals dependent upon a phase difference between the reference clock signal and a feedback clock signal. A loop filter includes a capacitor. The loop filter integrates the charge up and charge down control signals to provide a variable bias voltage for selecting a delay to be added to the reference clock signal by the voltage control delay line. A source portion of a charge pump includes at least one switching transistor, a first sourcing transistor and at least another sourcing transistor. The sourcing transistors are in electrical communication with the capacitor. At least a current carrying terminal of the first sourcing transistor is electrically connected to a current carrying terminal of the source portion switching transistor. The source portion switching transistor is controlled by the charge up control signal and, if switched on, permits current to be sourced via the first sourcing transistor into the capacitor. The source portion further includes means for disabling the sourcing of current via the first sourcing transistor. A sink portion of the charge pump includes at least one switching transistor, a first sinking transistor and at least another sinking transistor. The sinking transistors are in electrical communication with the capacitor. At least a current carrying terminal of the first sinking transistor is electrically connected to a current carrying terminal of the sink portion switching transistor. The sink portion switching transistor is controlled by the charge down control signal and, if switched on, permits current to be sunk via the first sinking transistor from the capacitor. The sink portion further includes means for disabling the sinking of current via the first sinking transistor.

Conveniently, the current sourcing disabling means and the current sinking disabling means can, in some examples, each include a select transistor, the current sourcing or sinking via the first sourcing or sinking transistor being disabled if the select transistor is turned off.

Expediently, the current sourcing disabling means and the current sinking disabling means can, in some alternative examples, each include transmission gate means between a bias voltage terminal of a mirror master transistor and a bias voltage terminal of the first sourcing or sinking transistor, the current sourcing or sinking via the first sourcing or sinking transistor being disabled if the transmission gate means breaks a conduction path between the two bias voltage terminals.

Conveniently, the source portion switching transistor and the sourcing transistors can, in some examples, be PMOS transistors, and the sink portion switching transistor and the sinking transistors can, in some examples, be NMOS transistors.

Expediently, one current carrying terminal of each of the sourcing (or sinking) transistors can, in some examples, collectively all be electrically connected to the current carrying terminal (e.g. drain) of the source (or sink) portion switching transistor.

Conveniently, the charge pump can, in some alternative examples, further include another source portion switching transistor and another sink portion switching transistor, a current carrying terminal of the another sourcing transistor being electrically connected to a current carrying terminal of the another source portion switching transistor, and a current carrying terminal of the another sinking transistor being electrically connected to a current carrying terminal of the another sink portion switching transistor.

BRIEF DESCRIPTION OF THE DRAWINGS

Reference will now be made, by way of example, to the accompanying drawings which illustrate example embodiments.

DETAILED DESCRIPTION OF EXAMPLE EMBODIMENTS

In the following detailed description of example embodiments, a number of illustrated circuits and circuit components are of a type which performs known operations on electronic signals. Those skilled in the art will have knowledge of alternative circuits or circuit components which are recognized as equivalent because they provide the same operations on the signals. Similar or the same reference numerals and labeling may have been used in different figures to denote similar components or signals.

Figure 3:
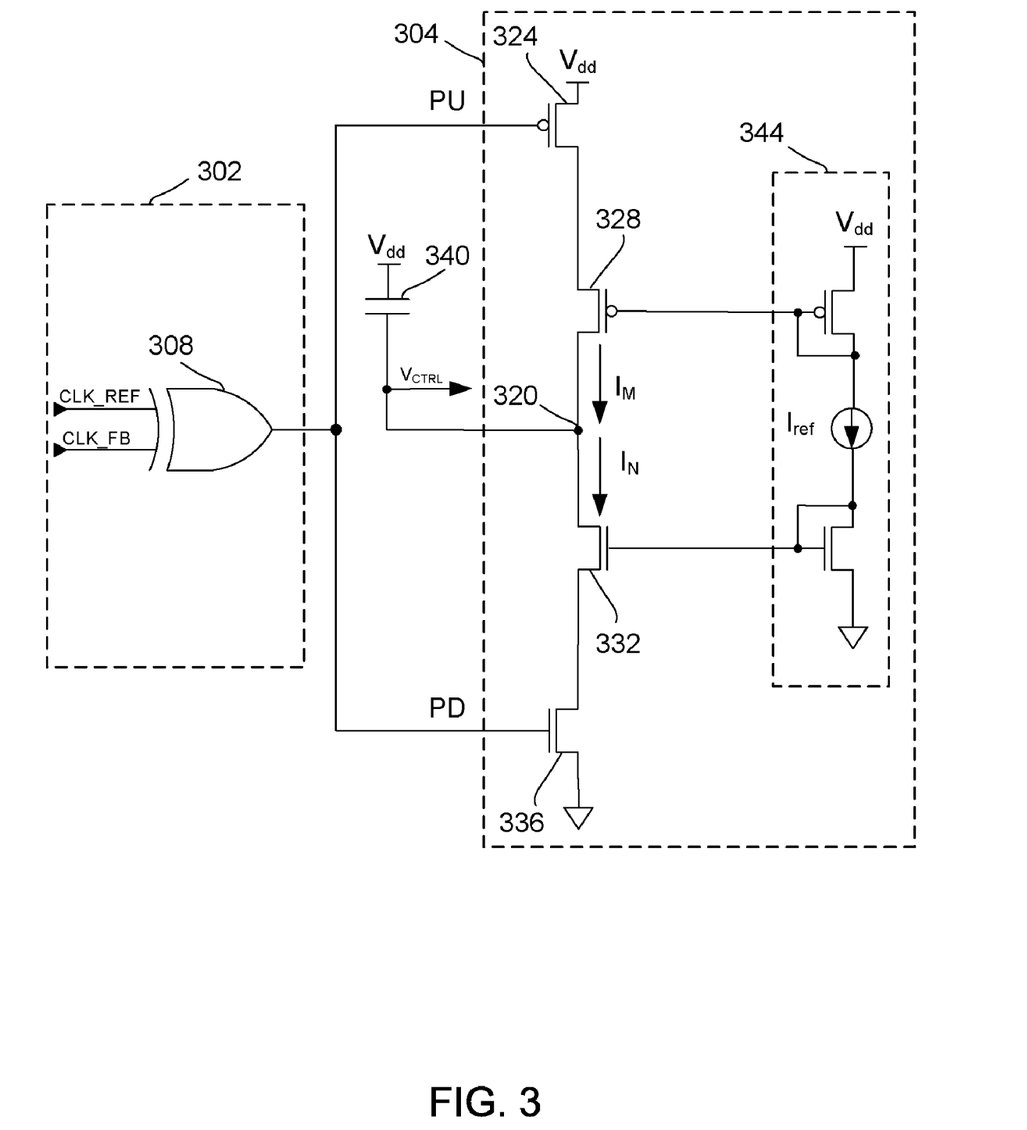
FIG. 3 is a circuit schematic of a phase detector, a charge pump that receives control signals from the phase detector also being illustrated.

Referring now to the drawings, FIG. 3 is a circuit schematic representation of an XOR-type phase detector 302 and a charge pump 304 (some circuit components not relevant to an understanding of example embodiments may have been omitted from FIG. 3). Those skilled in the art will appreciate that while XOR-type phase detectors can be employed in both DLLs and PLLs, their use is more common in DLLs; however their use in PLLs is also possible if the relevant design issues (for example, harmonic locking) are addressed.

Figure 4:
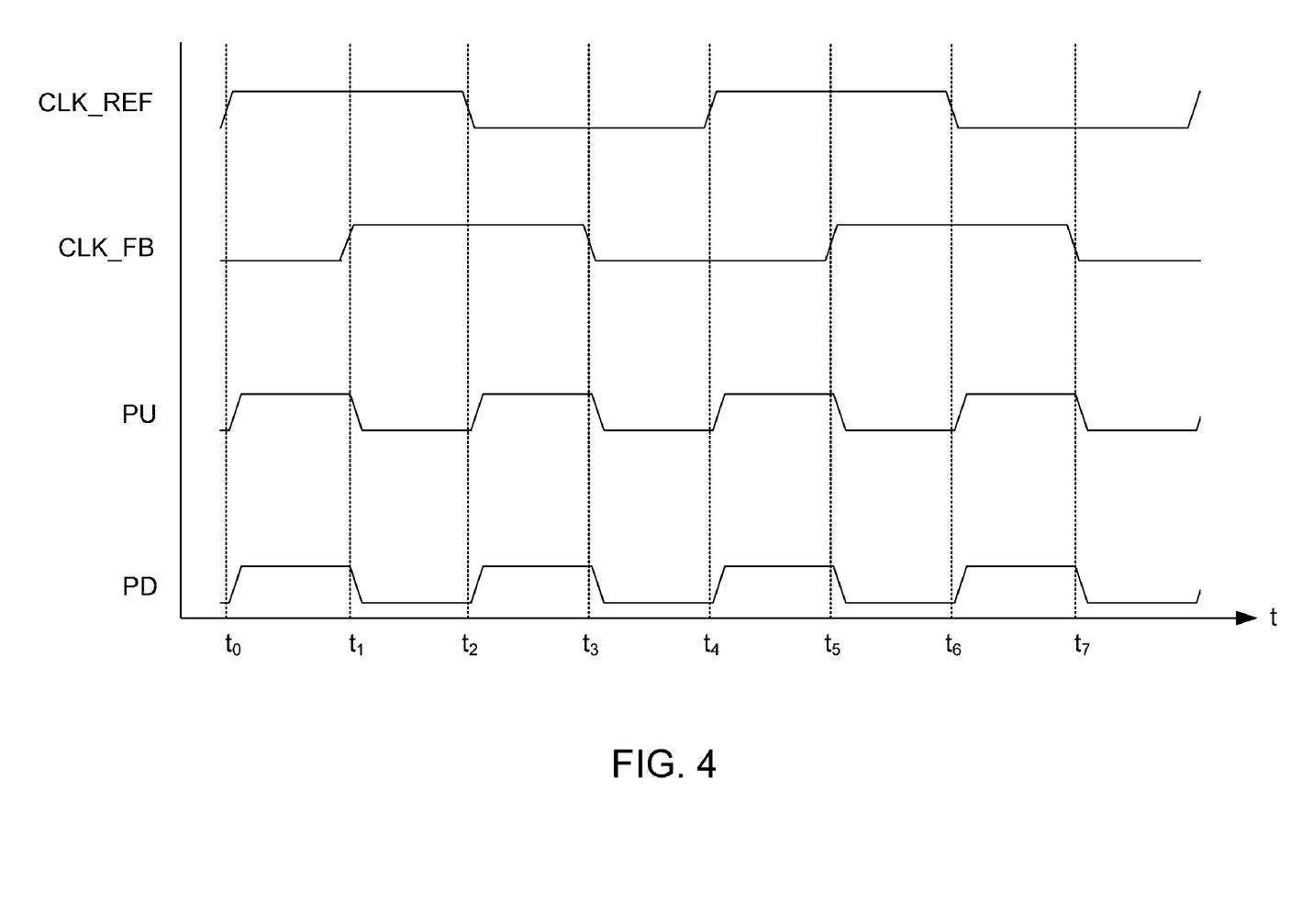
FIG. 4 is a timing diagram illustrating the operation of the phase detector of FIG. 3.

The phase detector 302 is level sensitive and includes an XOR logic gate 308 to which the signals CLK_REF and CLK_FB are applied at the inputs of the XOR logic gate 308. The output of the XOR logic gate 308 is electrically connected to both the gate of the switching transistor 324 and the gate of the switching transistor 336. In operation, when the two compared signals CLK_REF and CLK_FB are completely in phase, the pair of in phase inputs to the XOR logic gate 308 will result in XOR gate outputting a constant level of logic '0'. When the two compared signals CLK_REF and CLK_FB are 180 degrees apart (one is logic '0' when the other is logic '1', and vice versa) the XOR logic gate 308 puts out a steady logic '1' signal. Between the two extremes, the XOR logic gate 308 outputs logic '1' for half of the cycle. Thus, FIG. 4 is a timing diagram illustrating CLK_REF, CLK_FB, Pulse Up (PU) control signal and Pulse Down (PD) control signal when the XOR logic gate 308 outputs logic '1' for half of the cycle. (It has been assumed for the above description that both compared signals CLK_REF and CLK_FB have 50 percent duty cycles.)

With respect to the illustrated charge pump 304, it includes a source portion and a sink portion between which is a $V_{CTRL}$ node 320. The sourcing portion includes a switching transistor 324 and a sourcing transistor 328, which are PMOS transistors in the illustrated example. The sinking portion includes a switching transistor 336 and a sinking transistor 332, which are NMOS transistors in the illustrated example. The illustrated charge pump 304 also includes a current mirror 344 for mirroring current in the transistors 328 and 332. The current mirror 344 also establishes the bias voltages being applied to the gates of the transistors 328 and 332. A capacitor 340 has one terminal electrically connected to Vdd and another terminal electrically connected to the $V_{CTRL}$ node 320. As will be appreciated by those skilled in the art, $V_{CTRL}$ can be changed by net charging or net discharging of the capacitor 340, and by bringing about a change in $V_{CTRL}$, a phase shift can be effected. Capacitor 340 can be a passive component of the loop filter, or alternately, capacitor 340 can be a component of charge pump 304.

Charging is achieved by adding current to the capacitor 340, while discharging is achieved by removing current from the capacitor 340. It will be seen that if currents $I_M$ and $I_N$ have equal magnitudes over a period of time, then the capacitor 340 will continually charge and discharge by equal amounts and equal durations resulting in no net change to voltage $V_C$ at the $V_{CTRL}$ node 320.

The conditions for equal $I_M$ and $I_N$ magnitudes in the illustrated example charge pump is as follows. $I_M$ and $I_N$ will have equal magnitudes if, for example (i) the width-to-length (W/L) ratio of the transistor 328 and the PMOS FET of the current mirror are equal; and (ii) the W/L ratio of the transistor 332 and the NMOS FET of the current mirror are equal. (In at least one example, regulation of current is further facilitated by use of an operational amplifier as described and illustrated in commonly assigned US patent application Publication No. 2005/0162200 of Haerle.)

With respect to when $I_M$ and $I_N$ will have equal durations in the illustrated example charge, under the assumption of clocks of 50 percent duty cycle, $I_M$ and $I_N$ will repeatedly be current pulses of the same duration if the CLK_FB signal is phase shifted by 90 degrees with respect to the CLK_REF signal.

FIG. 4 is a sequence, or timing, diagram showing the operation of phase detector 302 of FIG. 3. FIG. 4 illustrates traces for input signals CLK_REF, CLK_FB and output signals PU and PD. It is assumed that the circuit is operating at a steady state, meaning that CLK_FB has reached the 90 degree phase shift relative to CLK_REF. As shown in FIG. 4, in one full CLK_REF clock cycle (ie. between $t_0$ and $t_4$), signals PU and PD will cycle between the high and low logic states. Therefore, transistors 324 and 336 are constantly, and alternately, turned on and off.

Figure 5:
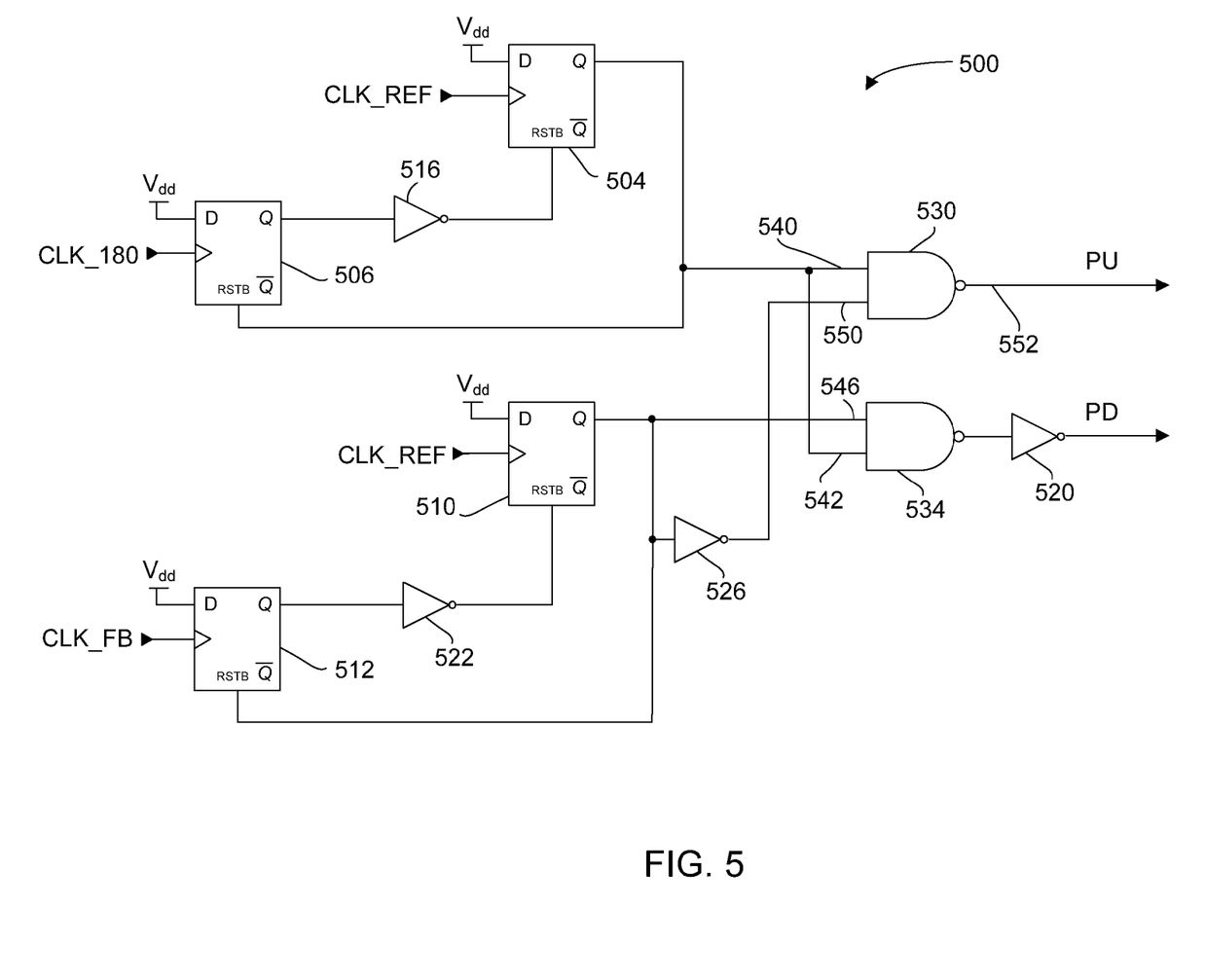
FIG. 5 is a circuit schematic of a phase detector in accordance with an example embodiment.

Reference will now be made to FIG. 5. FIG. 5 is a circuit schematic of a phase detector 500 in accordance with an example embodiment. As will be appreciated by those skilled in the art, not all components that will be present in an actual implementation have been illustrated, these absent components having been omitted in order to improve clarity and with an appreciation that their inclusion would not consequently impact an understanding of the illustrated example embodiment. The phase detector 500 can be employed within a DLL like the DLL shown in FIG. 1 (from a system perspective). Employment of the phase detector 500 within a PLL like the PLL shown in FIG. 2 (from a system perspective) may be less likely; however if the relevant design issues (for example, harmonic locking) are addressed, use of the phase detector 500 within PLLs is also possible. Also, the phase detector 500 may, in some examples, be used in combination with the charge pump circuits of FIGS. 7 and 8 (descriptions of which are provided in later paragraphs of this disclosure).

The illustrated phase detector 500 includes: four D Flip-Flops 504, 506, 510 and 512, four inverters 516, 520, 522 and 526, and two NAND logic gates 530 and 534. The illustrated phase detector 500 receives four input signals: CLK_REF, CLK_FB, CLK_180 and $V_{dd}$. CLK_REF is electrically connected to the clock inputs of the D Flip-Flops 504 and 510. (Each of the D Flip-Flops illustrated in FIG. 5 is rising-edge triggered.) CLK_FB is electrically connected to the clock input of the D Flip-Flop 512. CLK_180, which is a 180 degree phase shifted version of CLK_REF, is electrically connected to the clock input of the D Flip-Flop 506. Finally, $V_{dd}$ is electrically connected to the inputs of the D Flip-Flops 504, 506, 510 and 512.

Still with reference to the D Flip-Flops, the output of the D Flip-Flop 504 is electrically connected to a first input of the NAND logic gate 530, a first input of the NAND logic gate 534, and the reset (RSTB) terminal of the D Flip-Flop 506. Also, the output of the D Flip-Flop 506 is electrically connected to the input of the inverter 516, the output of the inverter 516 being electrically connected to the RSTB input of the D Flip-Flop 504. The output of the D Flip-Flop 510 is electrically connected to a second input of the NAND logic gate 534, and also the RSTB input of D Flip-Flop 512 and the input of inverter 526, the output of the inverter 526 being electrically connected to a second input of the NAND logic gate 530. Additionally, the output of the D Flip-Flop 512 is electrically connected to the input of inverter 522, the output of the inverter 522 being electrically connected to the RSTB input of the D Flip-Flop 510.

A Pulse UP (PU) control signal provided to a charge pump is generated at the output of the NAND logic gate 530. (It will be understood that the term charge up control signal used in this application also refers to a control signal for controlling charging within a charge pump.) A Pulse Down (PD) control signal, which is also provided to the charge pump, is generated at the output of the inverter 520, the output of the NAND logic gate 534 being electrically connected to the input of the inverter 520. (It will be understood that the term charge down control signal used in this application also refers to a control signal for controlling discharging within a charge pump.)

In operation, the PU and PD signals produced by the illustrated phase detector 500 will cause, within the charge pump to which these signals are electrically connected, $V_{CTRL}$ node capacitor charging/discharging activity during only half of the clock period. This behavior of the phase detector 500 will be apparent when the operation of the D Flip-Flops 504, 506, 510 and 512 is understood.

Figure 6:
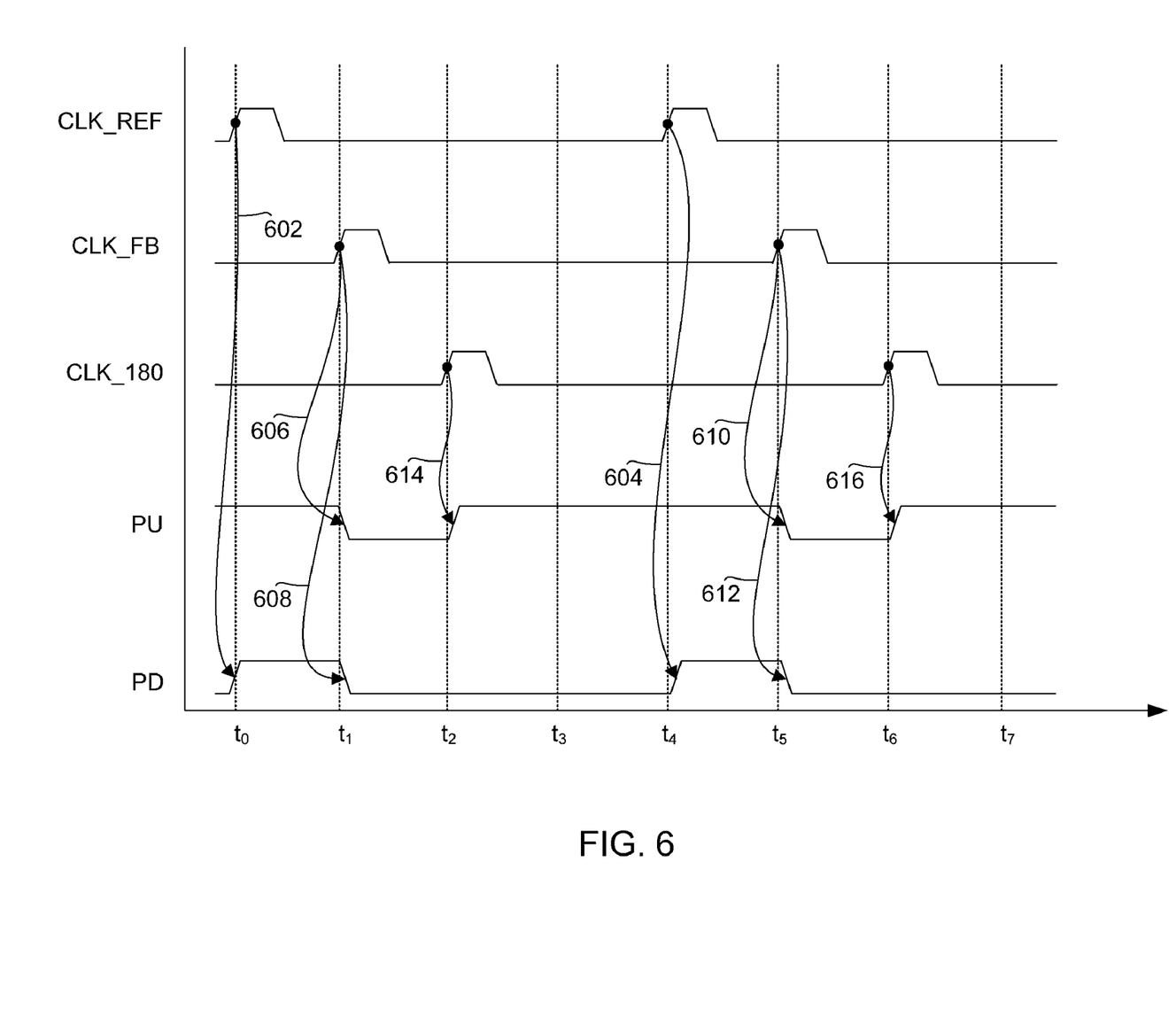
FIG. 6 is a timing diagram illustrating the operation of the phase detector of FIG. 5.

In the behavioral description of the phase detector 500 that follows, reference will be made to both FIGS. 5 and 6. FIG. 6 is a timing/sequence diagram illustrating the operation of the phase detector 500 with CLK_FB phase shifted 90 degrees relative to CLK_REF (as previously explained, in some examples this will be the desired phase shift for the clock signal so that the clock signal is properly aligned in the center of its associated data). Also, it will be understood that the clock signals illustrated in FIG. 6 have duty cycles that are significantly less than 50 percent, but have the same period as the clock signals shown in FIG. 4. Those skilled in the art will understand that clocks having a 50 percent duty cycle can be used.

As explained in more detail below, in response to detection of a rising edge of CLK_REF (reference clock signal) the PD control signal will change logic levels (logic '0' to logic '1') and also the logic level of the PU control signal will be maintained (the logic level will stay at logic '1') thereby enabling charge pump discharging, while keeping charge pump charging disabled. Referring to the D Flip-Flops 504 and 510, these Flip-Flops output the logic level on their input, which is logic '1' (Vdd) on the rising edge of CLK_REF. The logic '1' on the output of the D Flip-Flop 504 is received at an input 540 of the NAND logic gate 530 and at an input 542 of the NAND logic gate 534. The logic '1' at the output of the D Flip-Flop 504 is also received by the RSTB input of the D Flip-Flop 506, which is ignored because the RSTB input is active "low". The logic '1' at the output of the D Flip-Flop 510 is received by input 546 of the NAND logic gate 534 and the input of the inverter 526, which inverts the logic '1' to a logic '0' that is received at input 550 of the NAND logic gate 530. The logic '1' at the output of the D Flip-Flop 510 is also received by the RSTB input of the D Flip-Flop 512, but again, as previously explained, the D Flip-Flop 512 ignores this. If a logic '1' received at the input 540 and a logic '0' is received at the input 550, output 552 of the NAND logic gate 530 will be logic '1'. Therefore, the PU signal is logic '1' with the result being that charging in the charge pump remains disabled. With a logic '1' signal on the input 546 of the NAND logic gate 534 and a logic '1' signal on the input 542 of the NAND logic gate 534, the output of the NAND logic gate 534 is logic '0'. The inverter 520 inverts the signal so that the PD signal will be logic '1' enabling the charge pump, with respect to which the phase detector 500 communicates its control signals, to carry out discharging. Thus, in response to detection of a rising edge of CLK_REF, the PD control signal will change logic levels, as shown by transition arrows 602 and 604 in FIG. 6.

The next rising edge occurs in the CLK_FB signal (feedback clock signal). (Those skilled in the art will appreciate that harmonic locking problems can occur in PLLs if the edge of the CLK_FB signal becomes more than 180 degrees out of phase from the corresponding edge in the CLK_REF signal.) As explained in more detail below, in response to detection of the rising edge of CLK_FB, the PU control signal will change logic levels (logic '1' to logic '0') and also the PD control signal will change logic levels (logic '1' to logic '0') thereby enabling charge pump charging and disabling charge pump discharging. Referring to the D Flip-Flop 512, its clock input receives the CLK_FB signal. In response, the D Flip-Flop 512 outputs a logic '1' which is inverted by the inverter 522. A logic '0' at the RSTB input of the D Flip-Flop 510 forces the output of the D Flip-Flop 510 to logic '0', and this change in logic levels causes logic '0' to be received at the input 546 and logic '1' to be received at the input 550. The outputs of the NAND logic gates 530 and 534 now change their logic levels so that the PU signal changes from logic '1' to logic '0' enabling charging within the charge pump, and also the PD signal changes from logic '1' to logic '0' disabling discharging within the charge pump. Thus, in response to detection of a rising edge of CLK_FB, both the PU and PD control signals will change logic levels, as shown by transition arrows 606, 608, 610 and 612 in FIG. 6. The transition of the PD signal from the active logic level to the inactive logic level marks the end of a duration of time substantially similar to a time between the edge of CLK_REF at $t_0$ and the edge of CLK_FB at $t_1$.

The next rising edge occurs in the CLK_180 signal (an additional reference clock signal, phase shifted 180 degrees from CLK_REF, so that its rising edge is about midway between sequential rising edges of CLK_REF, providing indication of this midway point in time). As explained in more detail below, in response to detection of the rising edge of CLK_180 signal, the PU control signal will change logic levels (logic '0' to logic '1') and also the logic level of the PD control signal will be maintained (the logic level will stay at logic '0') thereby disabling charge pump charging and keeping charge pump discharging disabled. Referring to the D Flip-Flop 506, its clock input receives the CLK_180 signal. In response, the D Flip-Flop 506 outputs a logic '1' which is inverted by the inverter 516. A logic '0' at the RSTB input of the D Flip-Flop 504 forces the output of the D Flip-Flop 504 to logic '0', and this change in logic levels causes a logic '0' to be received the input 540 of the NAND logic gate 530, so the output of the NAND logic gate 530 changes from logic '0' to logic '1' while the outputs of the NAND gate 534 and the inverter 520 remain unchanged. Therefore, the PU signal changes from logic '0' to logic '1' disabling charging within the charge pump, and also the logic level of the PD signal will be maintained (the logic level will stay at logic '0') keeping charge pump discharging disabled. Thus, in response to detection of a rising edge of CLK_180, the PU control signal will change logic levels, as shown by transition arrows 614 and 616 in FIG. 6. The transition of the PU signal from the active logic level to the inactive logic level marks the end of a duration of time substantially similar to a time between the edge of CLK_FB at $t_1$ and the edge of CLK_180 at $t_2$.

In a steady state, the change in the PU and PD signals triggered by the CLK_FB rising edge will occur about one quarter of a clock period subsequent to the previous change in the PD signal triggered by the rising edge of the CLK_REF signal. During the roughly one quarter clock period between the CLK_REF and the CLK_FB rising edge, discharging occurs and charging does not occur. Also in the steady state, the change in the PU signal triggered by the CLK_180 rising edge will occur about one quarter of a clock period subsequent to the previous change in the PU and PD signals triggered by the rising edge of the CLK_FB signal. During the roughly one quarter clock period between the CLK_FB and the CLK_180 rising edge, charging occurs and discharging does not occur. During the remainder of the clock period neither charging nor discharging occurs. For example, during a half clock period between times $t_2$ and $t_4$ (see timing diagram of FIG. 6) neither charging nor discharging occurs (i.e., the PU and PD signals from the phase detector 500 would result in the switching transistors of the DLL's charge pump both being simultaneously switched off for half of the clock period, and hence the loop filter capacitor would be neither charged nor discharged during that period). During a corresponding period of time $t_2$ to $t_4$ for the phase detector 308 of FIG. 3, charging and discharging is occurring (see the logic levels of the PU and PD signals in the timing diagram of FIG. 4). The phase detector 500 may thus have the advantage of permitting implementation of a DLL with reduced power consumption as compared to the phase detector 308.

The phase detector 500 eliminates the need for the reference clock signals that were previously discussed in previous paragraphs of the disclosure, or in other words, the phase detector 500 eliminates the need to have available a master DLL or PLL that would ordinarily provide the two reference clock signals used for phase shifting (however, as explained previously and as will be discussed in more detail below, the CLK_180 signal will, in some examples, be provided to the phase detector in order for the phase detector to operate as intended).

It will be understood that an additional characteristic of the illustrated phase detector 500 is that it is edge triggered rather than level sensitive. Typically, an edge triggered phase detector will not be subject to the same duty cycle requirements that a level sensitive phase detector is subject to.

Those skilled in the art will also appreciate that phase control signals similar to those generated by the illustrated phase detector 500 can be generated by alternative phase detectors comprised of different logic gates and circuitry than the phase detector 500. For example, where CLK_REF is a 50 percent duty cycle clock, by replacing the D Flip-Flop 506 with one that is falling-edge triggered rather than rising-edge triggered, CLK_REF can be applied to the substituted D Flip-Flop, eliminating the need for CLK_180. With the D Flip-Flops 504 and 510 being triggered on a rising edge of the CLK_REF signal, the flip-flop put in substitution for the D Flip-Flop 506 is triggered on the falling edge (edge next in succession to the rising edge). While the above described implementation can be realized in some systems having phase detectors, it should be noted that in at least some instances it may be difficult to produce and make available a 50 percent duty cycle clock.

In some example embodiments, generated phase control signals may not exhibit the same logic level transitions that are characteristic of the illustrated phase detector 500. As a simple example, if one were to add inverters along the paths between the phase detector and the gates of the switching transistors 324 and 336 (FIG. 3) one of skill in the art could readily alter the design of the phase detector to respond to the previously described clock edges in a similar manner, but with generated phase control signals having bit (logic level) sequences opposite to those of the phase detector 500.

Other alternative example phase detectors are also contemplated. For instance, it will be understood that it would be straightforward for one of skill in the art to modify the illustrated phase detector 500 to realize a phase detector that would respond to falling clock edges rather that rising clock edges. Such a phase detector could achieve at least substantially the same effects and benefits associated with the illustrated phase detector 500.

Figure 7:
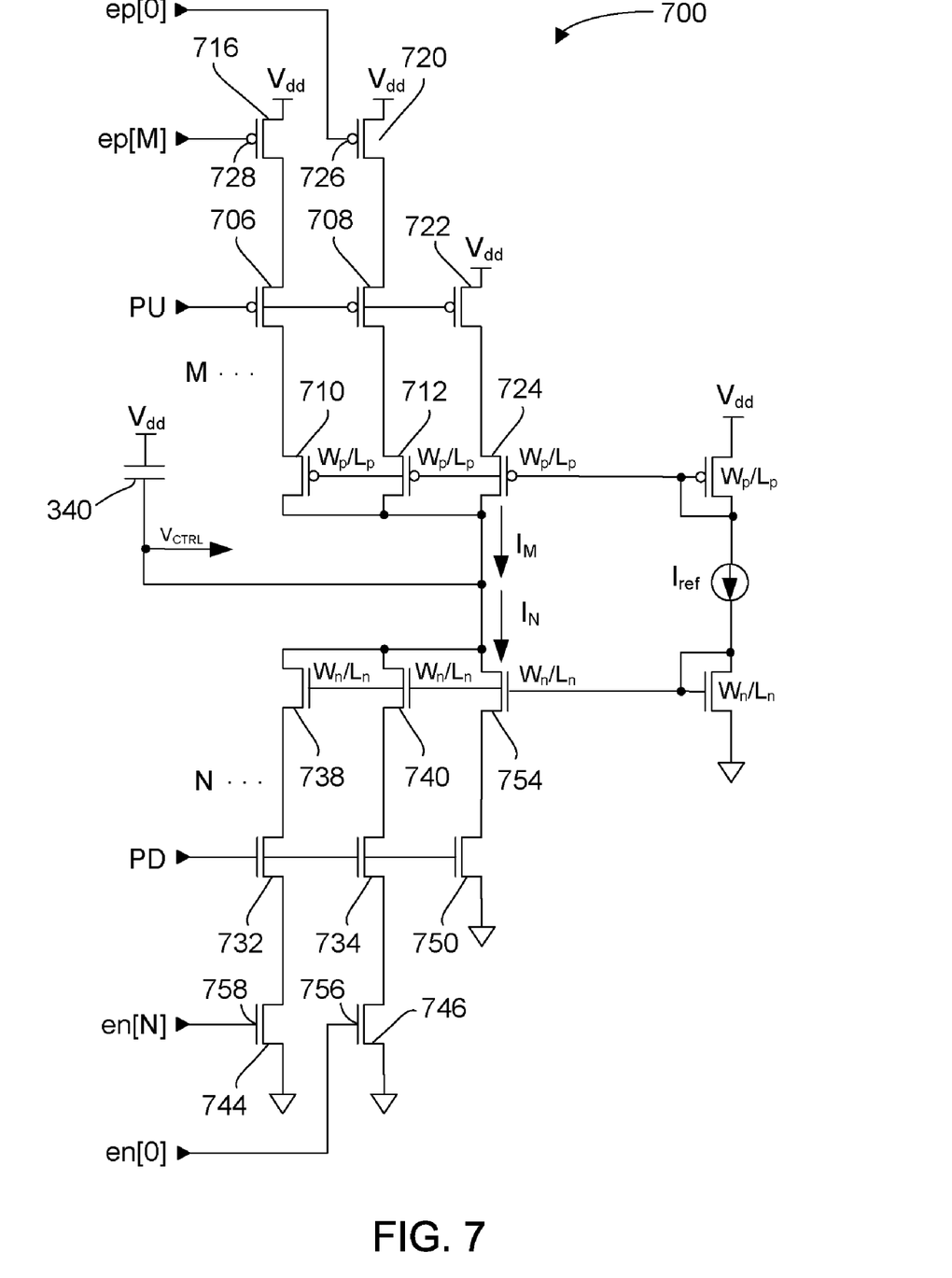
FIG. 7 is a circuit schematic of a charge pump in accordance with an example embodiment.

Reference will now be made to FIG. 7. FIG. 7 is a circuit schematic of a charge pump 700, in accordance with an example embodiment. As is known in the art, charge pump circuits uses capacitors to create either a higher or lower voltage. With respect to PLLs, a charge pump can be used to provide a control voltage applied to the VCO of the PLL. With respect to DLLs, a charge pump can be used to provide a control voltage for the VCDL of the DLL.

Referring now to the source portion of the illustrated charge pump 700, in this portion there are secondary switching transistors 706 and 708, secondary sourcing transistors 710 and 712, and select transistors 716 and 720. When current flows through primary switching transistor 722 and primary sourcing transistor 724, current will only flow through the secondary switching transistor 708 and the secondary sourcing transistor 712 if a logic '0' signal is applied to gate 726 of the select transistor 720, and current will only flow through the secondary switching transistor 706 and the secondary sourcing transistor 710 if a similar logic '0' signal is applied to gate 728 of the select transistor 716. Thus, the sourcing of current via one or more of the secondary sourcing transistor 710 and 712 can be disabled if one or more of the select transistors 716 and 720 is made non-conducting. In the presently shown embodiment, gate 726 is controlled by enabling signal ep[0] and gate 756 is controlled by enabling signal en[0], while gate 728 and 758 are controlled by enabling signals ep[M] and en[N] respectively. M and N are integer values greater than 0, as there can be any number of select transistors and secondary switching transistors included in the circuit of FIG. 7. In various alternate embodiments, N can be equal to M, or N can be different from M.

In the sink portion of the illustrated charge pump 700, there are secondary switching transistors 732 and 734, secondary sinking transistors 738 and 740, and select transistors 744 and 746. When current flows through primary switching transistor 750 and primary sinking transistor 754, current will only also flow through the secondary switching transistor 734 and the secondary sinking transistor 740 if a logic '1' signal is applied at gate 756 of the select transistor 746, and current will only flow through the secondary switching transistor 732 and the secondary sinking transistor 738 if a similar logic '1' signal is applied at gate 758 of the select transistor 744. Thus, the sinking of current via one or more of the secondary sinking transistor 738 and 740 can be disabled if one or more of the select transistors 744 and 746 is made non-conducting.

As will be appreciated by those skilled in the art, source portion current $I_M$ will be greatest when all three of the sourcing transistors 710, 712 and 724 are sourcing current, and $I_M$ will be smaller when one or more of the select transistors 716 and 720 are turned off so that one or more of the secondary sourcing transistors 710 and 712 do not source additional current. Similarly, sink portion current $I_N$ will be greatest when all of the sinking transistors 738, 740 and 754 are sinking current. However, $I_N$ will be less if one or more of the select transistors 744 and 746 are turned off so that one or more of the secondary sinking transistors 732 and 734 will not sink additional current. In this manner, the illustrated charge pump 700 permits scaling of charge pump currents to be carried out.

If one takes into account that, in the illustrated charge pump 700, the phase shift corresponding to steady state will approximately follow equation (1) below:

$$\text{Phase Shift}=180*I_N/(I_M+I_N) \quad (1)$$

It will be seen that scaling of charge pump currents as previously described provides for the ability to make fine-tuned adjustments in phase shifting. Also, if $I_N$ and $I_M$ are expressed as $(N+1)*I_{ref}$ and $(M+1)*I_{ref}$ respectively, where N and M represent the current mirror ratios, then the relationship expressed in equation (2) below also holds:

$$\text{Phase Shift}=180*(N+1)/(M+N+2). \quad (2)$$

As will be appreciated by those skilled in the art, a system that includes the charge pump 700 can also include a main controller having registers that provide the enable signals for controlling which of the select transistors 716, 720, 744 and 746 are made conducting or non-conducting. In particular, each of the enable signals from such main controller registers would be applied to one of the gates 726, 728, 756 and 758. Alternate example embodiments of FIG. 7 can include any number of select transistors and corresponding secondary switching transistors. These select transistors and corresponding secondary switching transistors can be sized identically to the explicitly shown select transistors and secondary transistors to provide substantially linear scaling of the currents $I_M$ and $I_N$. Alternately, these transistors can be sized differently to provide non-linear scaling of the currents $I_M$ and $I_N$. Furthermore, any combination and number of enable signals can be driven to the activate logic level to turn on their corresponding select transistors.

Figure 8:
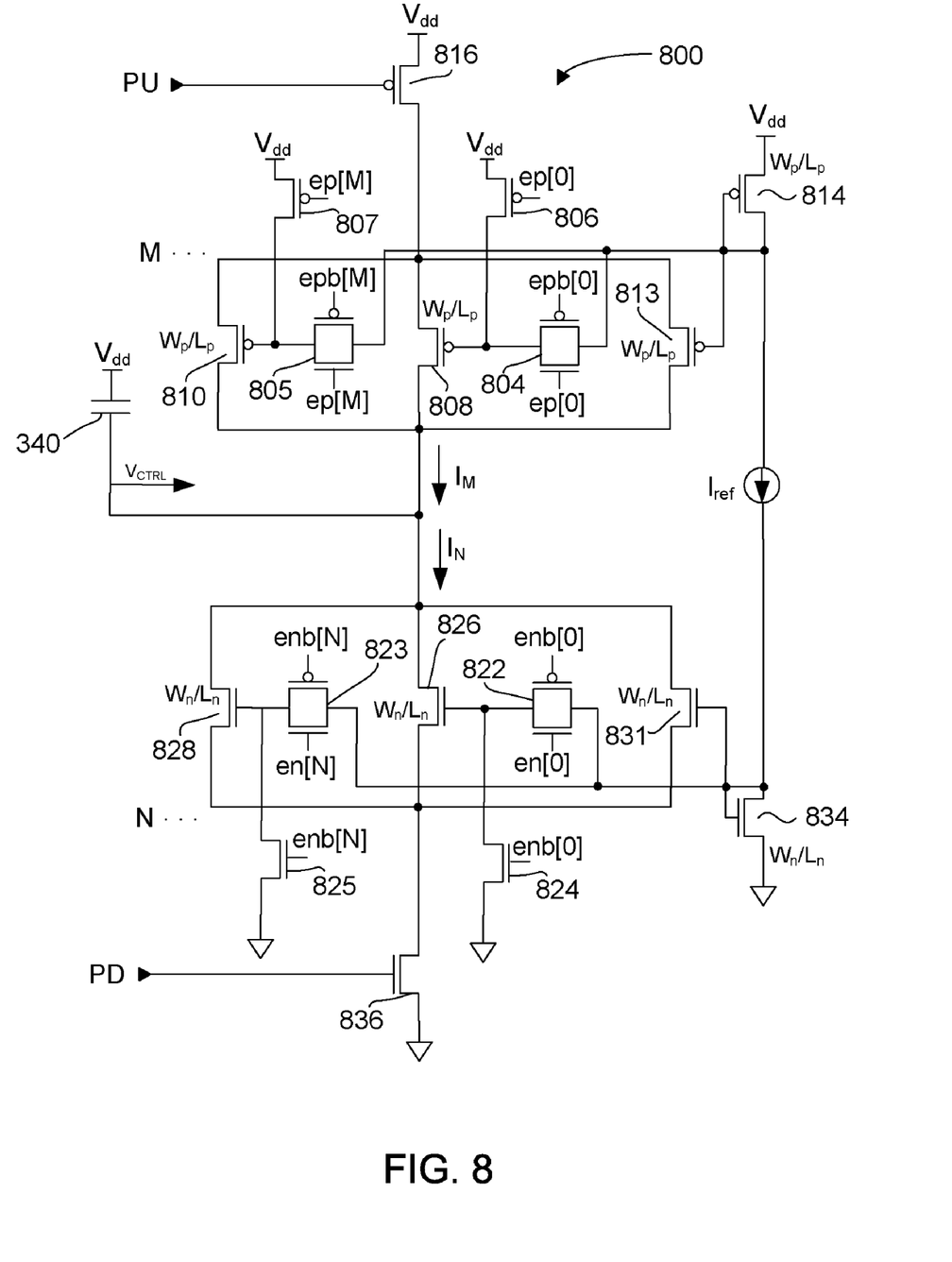
FIG. 8 is a circuit schematic of a charge pump in accordance with another example embodiment.

FIG. 8 is a circuit schematic of a charge pump 800, in accordance with another example embodiment. As will be evident from the explanation that follows, it will be seen that the charge pump 800 scales charge pump currents in a similar matter to the charge pump 700 of FIG. 7.

In the source portion of the illustrated charge pump 800, there are M sourcing transistors (two of which are shown and labeled 808 and 810), M transmission gates (two of which are shown and labeled 804 and 805), M pull-up transistors (two of which are shown and labeled 806 and 807), a mirror master transistor 814, and a switching transistor 816. It will be understood that the mirror master transistor 814 can mirror current in any one or more of the sourcing transistors 808 and 810, but only if the interposed transmission gate 804 and/or 805 enables a path for the master transistor 814 to mirror current to sourcing transistor(s). Thus, the sourcing of current via one or more of the M sourcing transistors can be disabled if path(s) through the transmission gate(s) are disabled. By contrast, the sourcing of current via sourcing transistor 813 is not impacted by any of the transmission gates 804.

In the sink portion of the charge pump 800, there are N sinking transistors (two of which are shown and labeled 826 and 828), N transmission gates (two of which are shown and labeled 822 and 823), N pull-down transistors (two of which are shown and labeled 824 and 825), a mirror master transistor 834, and a switching transistor 836. Again, the mirror master transistor 834 can mirror current into one or more of the sinking transistors 826 and 828, but only if the interposed transmission gates 822 and/or 823 enable a path for the master transistor 834 to mirror currents to sinking transistor(s). If one or more of the N transmission gates cause the path(s) between the sinking transistor(s) and the master transistor 834 to be closed, then current will not be mirrored into that/those sinking transistor(s). Thus, the sinking of current via one or more of the N sinking transistors can be disabled if path(s) through the transmission gate(s) are disabled. By contrast, the sinking of current via sinking transistor 831 is not impacted by any of the N transmission gates.

As will be appreciated by those skilled in the art, the pull-up and pull-down transistors 806, 807, 824, 825 prevent the sourcing and the sinking transistors from turning on when their corresponding transmission gates are turned off. Also, it will be understood that each of the M transmission gates in the source portion of the charge pump 800 could be replaced by, for example, a PMOS transistor that would achieve a result similar to that achieved by use of a transmission gate. Similarly, each of the N transmission gates in the sink portion of the charge pump 800 could be replaced by, for example, an NMOS transistor that would achieve a result similar to that achieved by use of a transmission gate.

Still with reference to FIG. 8, it will be apparent that sourcing current $I_M$ will be largest when all three of the sourcing transistors 808, 810 and 813 are sourcing current, and when less than all three transistors are sourcing current, $I_M$ will be smaller. Similarly, it will be seen that $I_N$ will be largest when all three of the sinking transistors 826, 828 and 831 are sinking current, and $I_N$ will be smaller when less than all three sinking transistors are sinking current. In this manner, the illustrated charge pump 800 permits scaling of charge pump currents to be carried out.

If one takes into account that, in the illustrated charge pump 800, the phase shift corresponding to steady state will approximately follow equation (3) below:

$$\text{Phase Shift} = 180 * I_N / (I_M + I_N). \tag{3}$$

It will be seen that scaling of charge pump currents as previously described provides for the ability to make fine-tuned adjustments in phase shifting. Also, if $I_N$ and $I_M$ are expressed as $(N+1)*I_{ref}$ and $(M+1)*I_{ref}$ respectively, where N and M represent the current mirror ratios, then the relationship expressed in equation (4) below also holds:

$$\text{Phase Shift} = 180 * (N+1) / (M+N+2). \tag{4}$$

As will be appreciated by those skilled in the art, a system that includes the charge pump 800 can also include a main controller having registers that provide the enable signals ep[M:0] and epb[M:0] for controlling which of the M transmission gates in the source portion of the charge pump 800 are enabled or disabled, and for controlling which of the M pull-down in the source portion of the charge pump 800 are made conducting or non-conducting. In particular, each of the enable signals from such main controller registers would be applied to at least one of the gates of the transmission gates and/or pull-up/pull-down transistors. Similar enable signals could also be provided in a similar manner for similar control in the sink portion of the charge pump 800.

A number of circuits and methods for scaling of charge pump currents in order to make fine-tuned adjustments in phase shifting have been described and illustrated. It will be apparent that these circuits and methods can be modified by one skilled in the art, and in so doing other circuits and methods can be realized which share at least some non-trivial similarities to the charge pump current scaling circuits and methods described herein. For example, one could incorporate circuitry into a charge pump that would continually cause an offset current to be sourced/added into and/or sunk/removed from the capacitor 340 regardless of the logic levels of the PU and PD control signals. Such an implementation would, in some examples, be less energy efficient than implementations previously described in this disclosure. It should be noted that capacitor 340 shown in the embodiments of the invention shown in FIGS. 7 and 8 can be a passive component of the loop filter, or alternately, capacitor 340 can be a component of charge pumps 700 and 800.

It will be understood that adjustments in phase shifting in accordance with example embodiments could be carried out, for example, during testing/calibration and/or dynamically.

Certain adaptations and modifications of the described embodiments can be made. Therefore, the above discussed embodiments are considered to be illustrative and not restrictive.

What is claimed is:

1. A charge pump comprising:
    a current source circuit enabled in response to a first control signal for providing a first source current and a selectively adjustable second source current to a node, the selectively adjustable second source current being provided in response to first enabling signals; and,
    a current sink circuit enabled in response to a second control signal for sinking a first sink current and a selectively adjustable second sink current from the node, the selectively adjustable second sink current being provided in response to second enabling signals.

2. The charge pump of claim 1, wherein the current source circuit includes a primary sourcing transistor that receives a reference voltage for regulating the first source current, and the current sink circuit includes a primary sinking transistor that receives the reference voltage for regulating the first sink current.

3. The charge pump of claim 2, wherein the first source current is provided by a primary source switching transistor and the primary sourcing transistor connected serially between a high voltage supply and the node, the primary source switching transistor being controlled by the first control signal, and the primary sourcing transistor being controlled by the reference voltage.

4. The charge pump of claim 2, wherein the first sink current is provided by the primary sinking transistor and a primary sink switching transistor connected serially between the node and a low voltage supply, the primary sinking transistor being controlled by the reference voltage, and the primary sink switching transistor being controlled by the second control signal.

5. The charge pump of claim 2, wherein the selectively adjustable second source current is provided by a plurality of source current branches connected in parallel with each other.

6. The charge pump of claim 5, wherein each of the plurality of source current branches includes a select transistor, a secondary source switching transistor and a secondary sourcing transistor connected in series between a high voltage supply and the node, the select transistor being controlled by one of the first enabling signals, the source switching transistor being controlled by the first control signal, and the secondary sourcing transistor being controlled by the reference voltage.

7. The charge pump of claim 6, wherein a sum of the selectively adjustable second source current and the first source current is linearly scalable in magnitude.

8. The charge pump of claim 7, wherein the select transistor of each of the plurality of source current branches are identically sized to each other, and the secondary source switching transistor of each of the plurality of source current branches are identically sized to the primary source switching transistor.

9. The charge pump of claim 6, wherein a sum of the selectively adjustable second source current and the first source current is non-linearly scalable in magnitude.

10. The charge pump of claim 9, wherein the select transistor of each of the plurality of source current branches are sized differently from each other, and the secondary source switching transistor of each of the plurality of source current branches are sized differently from each other and from the primary source switching transistor.

11. The charge pump of claim 2, wherein the selectively adjustable second sink current is provided by a plurality of sink current branches connected in parallel with each other.

12. The charge pump of claim 11, wherein each of the plurality of sink current branches includes a select transistor, a secondary sink switching transistor and a secondary sinking transistor connected in series between the node and a low voltage supply, the select transistor being controlled by one of the second enabling signals, the sink switching transistor being controlled by the second control signal, and the secondary sinking transistor being controlled by the reference voltage.

13. The charge pump of claim 12, wherein a sum of the selectively adjustable second sink current and the first sink current is linearly scalable in magnitude.

14. The charge pump of claim 13, wherein the select transistor of each of the plurality of sink current branches are identically sized to each other, and the secondary sink switching transistor of each of the plurality of sink current branches are identically sized to the primary sink switching transistor.

15. The charge pump of claim 12, wherein a sum of the selectively adjustable second sink current and the first source current is non-linearly scalable in magnitude.

16. The charge pump of claim 15, wherein the select transistor of each of the plurality of sink current branches are sized differently from each other, and the secondary sink switching transistor of each of the plurality of sink current branches are sized differently from each other and from the primary sink switching transistor.

17. The charge pump of claim 3, wherein the selectively adjustable second source current is provided by a plurality of secondary sourcing transistors connected in parallel with each other and in series with the primary source switching transistor between the high voltage supply and the node, each of the secondary sourcing transistors selectively receiving the reference voltage in response to one of the first enabling signals.

18. The charge pump of claim 17, wherein each of the secondary sourcing transistors receives the reference voltage via a corresponding transmission gate controlled by one of the first enabling signals and a complement of the one of the first enabling signals.

19. The charge pump of claim 18, wherein each of the secondary sourcing transistors has a gate terminal coupled to the high voltage supply by a corresponding pull-up transistor when the one of the first enabling signals is at a logic level that turns off the corresponding transmission gate.

20. The charge pump of claim 4, wherein the selectively adjustable second sink current is provided by a plurality of secondary sinking transistors connected in parallel with each other and in series with the primary sink switching transistor between the node and the low voltage supply, each of the secondary sinking transistors selectively receiving the reference voltage in response to one of the second enabling signals.

21. The charge pump of claim 20, wherein each of the secondary sinking transistors receives the reference voltage via a corresponding transmission gate controlled by one of the second enabling signals and a complement of the one of the second enabling signals.

22. The charge pump of claim 21, wherein each of the secondary sinking transistors has a gate terminal coupled to the low voltage supply by a corresponding pull-down transistor when the one of the second enabling signals is at a logic level that turns off the corresponding transmission gate.

* * * * *